United States Patent
Quek et al.

(10) Patent No.: US 7,349,454 B2
(45) Date of Patent: Mar. 25, 2008

(54) METHOD OF MONITORING AND CONTROLLING A LASER DIODE

(75) Inventors: Irene Quek, Singapore (SG); Siok Been Yeo, Singapore (SG); Khia Ho Chang, Singapore (SG); Seng Yee Chua, Singapore (SG)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 159 days.

(21) Appl. No.: 11/223,520

(22) Filed: Sep. 9, 2005

(65) Prior Publication Data
US 2007/0071046 A1   Mar. 29, 2007

(51) Int. Cl.
*H01S 3/00* (2006.01)
(52) U.S. Cl. .............. 372/38.02; 372/38.01; 372/38.07; 372/46.01; 356/5.01; 398/197
(58) Field of Classification Search ............. 372/38.02, 372/38.07
See application file for complete search history.

(56) References Cited

U.S. PATENT DOCUMENTS

| | | | |
|---|---|---|---|
| 4,903,273 A | 2/1990 | Bathe | |
| 5,019,769 A | 5/1991 | Levinson | |
| 6,414,974 B1* | 7/2002 | Russell et al. | 372/38.02 |
| 2004/0114649 A1 | 6/2004 | Asuri et al. | |
| 2004/0131094 A1 | 7/2004 | Miremadi | |
| 2005/0286575 A1 | 12/2005 | Hattori | |

FOREIGN PATENT DOCUMENTS

| | | |
|---|---|---|
| EP | 0 061 034 | 8/1985 |
| EP | 1 083 643 | 9/2000 |
| EP | 1 424 753 | 11/2002 |

* cited by examiner

*Primary Examiner*—Minsun Oh Harvey
*Assistant Examiner*—Yuanda Zhang

(57) ABSTRACT

A method of controlling a laser diode measures an average light output power of the laser diode and compares the average light output power to a desired average light output power within a target range. If the average light output power is not within the target range, the slope efficiency is determined by measuring two light output powers at two different bias conditions. Each of the two light output powers is greater than a selected minimum light output power, which insures that each measurement occurs within the slope efficiency portion of the laser diode curve. A new bias current for the laser diode is calculated based on the measured slope efficiency so as to produce a new average light output power within the target range.

12 Claims, 5 Drawing Sheets

METHOD OF MONITORING AND CONTROLLING A LASER DIODE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Optical fiber communication systems ("OFCS") use modulated light to transmit information over optical fibers. Unlike electronic transmissions, optical transmissions are not susceptible to electromagnetic noise and interference, and provide very broad bandwidth. Light emitting devices, such as laser diodes, are used to produce light pulses that are transmitted on the OFCS. Examples of suitable laser diodes include distributed feedback ("DFB") lasers, Fabry-Perot ("FP") lasers, and vertical-cavity surface-emitting lasers ("VCSELs").

It is generally desirable that a light emitting device used in an OFCS produce pulses having a selected light power. Pulses that are too dim might not be reliably received by a photodetector at the opposite end of the optical fiber link, and pulses that are too bright might create an eye-hazard for a human operator. Light output (i.e. pulse light power) from a laser diode is a function of bias current, and increasing or decreasing the bias current increases or decreases the light output. However, different laser diodes will produce different light intensities for the same bias current. In other words, the light produced varies from part to part.

Binning is used to separate diode parts according to their operating characteristics, such as threshold current and slope efficiency. The laser diodes are used in circuits that provide external control for setting the biasing current so that it is suitable for a particular application. This approach requires extra pads to set the desired biasing current, and one-by-one testing to determine which bin each die is sorted to.

Aging and temperature can affect the bias current needed to achieve the desired light power. The control bits used to set the bias current in a particular application might not be sufficient to overcome changes in light power arising from aging or temperature effects. Closed-loop systems have been developed to compensate for changes in laser diode operating characteristics arising from aging and/or changes in temperature.

A closed-loop system is generally a feedback system that detects, evaluates, and compensates for changes in laser diode operating characteristics. This can ensure that a laser diode is able to operate at the desired bias point. Many different methodologies are used in the design and implementation of closed-loop monitoring system.

One closed-loop system computes the slope efficiency of a laser diode by reading the output light power at two different bias current levels of the power versus bias current curve. Both light power readings are taken at a power level above the minimum output light power, which occurs at a bias current above the threshold current. However, this assumes that the slope efficiency remains constant over time and temperature, which it does not.

Another closed-loop system computes the slope efficiency by measuring light power over a range of bias currents, and then sets the target bias current in a step-wise fashion based on the measured threshold current. However, this approach can take a long time, especially if the light power drifts outside the target range. Even if the light power is within the target range, determining the exact value of the threshold current is quite difficult and can take several measurements. Therefore, an improved technique for quickly and accurately determining the bias current for a particular light power from a laser diode is desirable.

BRIEF SUMMARY OF THE INVENTION

A method of controlling a laser diode measures an average light output power of the laser diode and compares the average light output power to a desired average light output power within a target range. If the average light output power is not within the target range, the slope efficiency is determined by measuring two light output powers at two different bias conditions. Each of the two light output powers is greater than a selected minimum light output power, which insures that each measurement occurs within the slope efficiency portion of the laser diode curve. A new bias current for the laser diode is calculated based on the measured slope efficiency so as to produce a new average light output power within the target range.

DETAILED DESCRIPTION OF THE EMBODIMENTS

I. Exemplary Diode Characteristic

Figure 1:
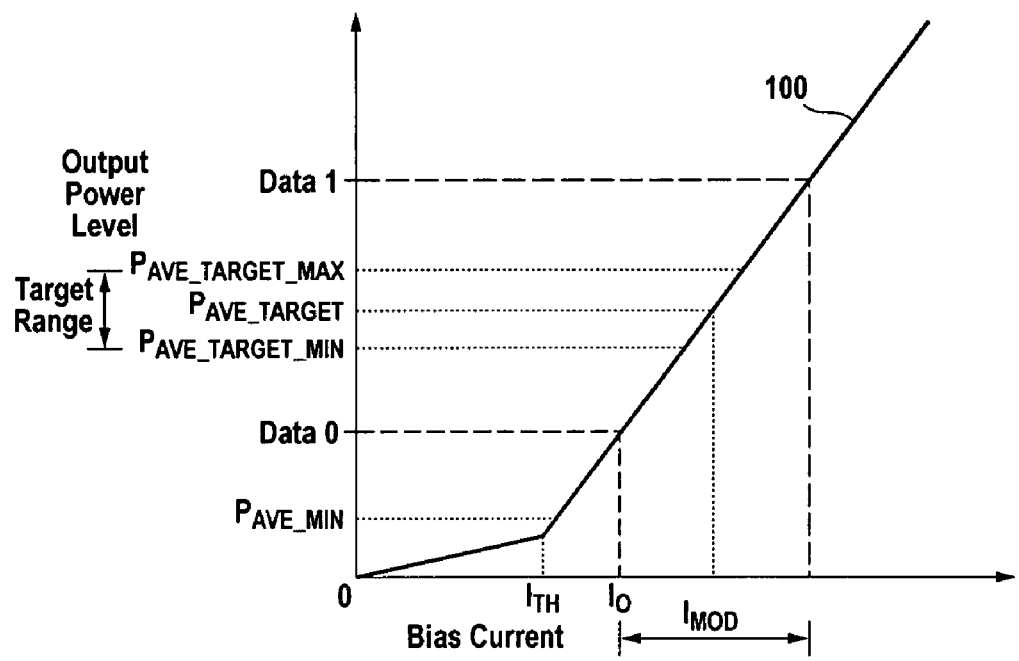
FIG. 1 shows a plot of light output power versus bias current for an exemplary laser diode.

FIG. 1 shows a plot 100 of average light output power ("$P_{AVE}$") versus bias current for an exemplary laser diode. $P_{AVE}$ is the average output power (typically expressed in mW) when the laser diode is transmitting a 1-0-1-0-1 . . . data stream. A DATA 0 (LOW) condition is when the laser diode is biased at a low bias current $I_0$, and a DATA 1 (HIGH) condition is when the laser is biased at a high bias current $I_0+I_{MOD}$. $P_{AVE}$ is the average of the output power level at DATA 1 and the output power level at DATA 0. For a fixed $I_{MOD}$, $P_{AVE}$ increases slightly with increasing bias current until the threshold current ("$I_{TH}$") 101 is reached, after which $P_{AVE}$ more rapidly increases with increasing bias current. The relationship between $P_{AVE}$ and bias current above $P_{AVE\_MIN}$ is called the slope efficiency ("SE").

Photodiodes are typically used as the light detectors in optical feedback loops. Such photodiodes have leakage ("dark") current. Measuring the SE above $P_{AVE\_MIN}$ ensures that the photodiode is measuring light from the laser diode, and not just its own leakage current. In other words, power detected above $P_{AVE\_MIN}$ is valid for computing the SE. Measuring the average power level (between the DATA 1 and DATA 0 states) of the laser diode while it is being modulated is more desirable than measuring the laser diode in a static condition because the average power is higher than the output power at the DATA 0 state. Furthermore, the modulation does not have to be turned off to measure average power, which allows monitoring $P_{AVE}$ while an application is running. Modulation would be turned off to measure a DATA 0 power in a static condition, which would interrupt the application.

It is desirable that the HIGH data state be easily distinguished from the LOW data state. Generally, $I_0$ is above $I_{TH}$ to provide a rapid increase in output power with $I_{MOD}$. It is desirable to maintain an average output power within a target range between $P_{AVE\_TARGET\_MAX}$ and $P_{AVE\_TARGET\_MIN}$. A typical application will have a desired target average output power $P_{AVE\_TARGET}$. If SE drops, such as from aging or at elevated temperature, $P_{AVE}$ will drop because both the power at $I_0$ (the LOW data state) and at $I_0+I_{MOD}$ (the HIGH data state) will decrease, and might drop below $P_{AVE\_TARGET\_MIN}$. Furthermore, the difference in output power between the HIGH and LOW data states decreases, which can make data reception more difficult.

Similarly, $I_{TH}$ typically increases with age and temperature. $I_{TH}$ can vary as much as 50% within a typical operating temperature range of an optical communication system. If $I_{TH}$ increases past the low bias current $I_0$, $P_{AVE}$ will decrease because the power-current plot 100 below $I_{TH}$ has a relatively shallow slope, and there will be less difference between the HIGH and LOW power outputs. It is desirable to adjust the manner in which the laser diode is driven to account for changes in both $I_{TH}$ and SE.

The targeted range for the average light power is dependent on the product application. In some applications, laser diodes are specified according to the average power and extinction ratio ("ER"). In a particular embodiment, the laser diode is specified according to the media-oriented systems transport ("MOST") standards. The targeted range insures that the output power provided by the laser diode is suitable for the application, even as the output power varies due to age or temperature.

Figure 2:
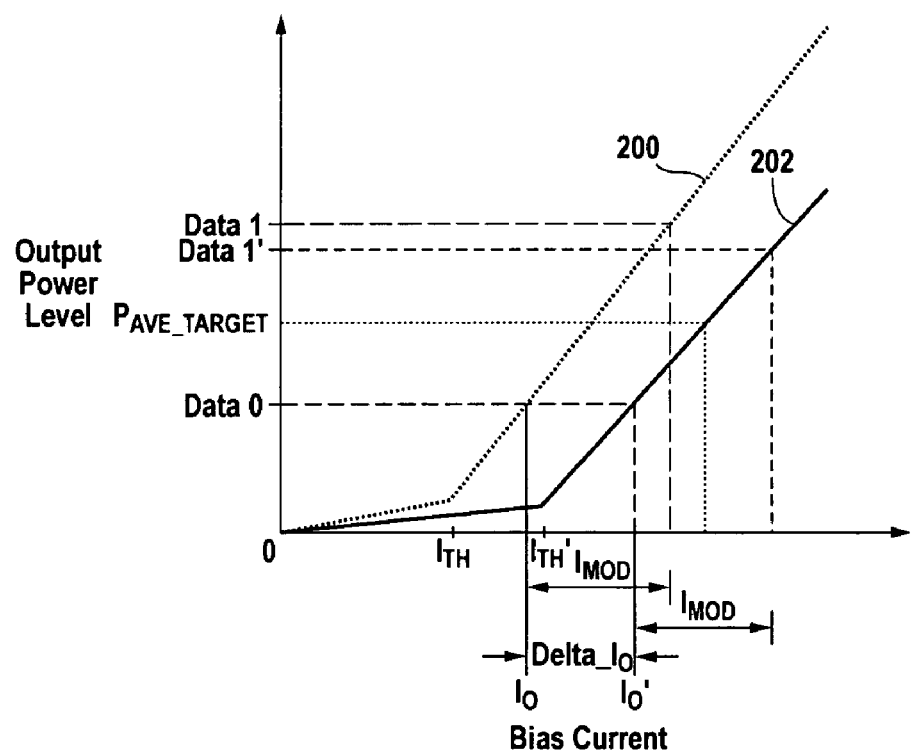
FIG. 2 shows plots of light output power versus bias current for an exemplary laser diode illustrating adjusting the bias current to account for temperature, process, or aging drifts according to an embodiment of the invention.

FIG. 2 shows plots 200, 202 of light output power versus bias current for an exemplary laser diode illustrating adjusting the bias current to account for temperature or aging drifts, or process variations according to an embodiment of the invention. During the fabrication of a run of laser diodes, some will have different power-current plots than others. In an application, the appropriate bias points ($I_0$ and $I_0+I_{MOD}$) for one laser diode will be different than for another.

The first plot 200 shows an initial power-current characteristic of a laser diode, and the second plot 202 shows a subsequent power-current characteristic of the laser diode after aging or at an elevated temperature. The threshold current has moved from a first current $I_{TH}$ to a higher current $I_{TH'}$. The new threshold current $I_{TH'}$ is greater than the original low bias current $I_0$. This condition is highly undesirable. In order to maintain DATA 0 at its original output power level, the low bias current $I_0$ is increased to $I_{0'}$.

One way to determine the proper value for $I_{0'}$ is by computing the difference ($I_0$) between $I_0$ and $I_{0'}$ that will provide a $P_{AVE}$ within the target range. This is done by first determining the present SE of the laser diode. SE is determined by measuring the light output power at two valid current levels. A valid current level is a current level that produces a $P_{AVE}$ greater than $P_{AVE\_MIN}$ (see FIG. 1). Upon power-up, when the laser output power is zero, a valid laser output power is found by increasing the bias current in a pre-determined step until an average power above $P_{AVE\_MIN}$ is detected. Determining the exact value of $I_{TH}$, as in done in a conventional technique and which can be difficult and time consuming, is not important, nor is taking multiple data points near $I_{TH}$ because $P_{MIN}$ is well above the light output power that would occur at $I_{TH}$ in either condition (e.g. at either temperature), thus insuring that both points are within the SE portion of the laser diode output curve. The appropriate value of $P_{MIN}$ depends on the amount of leakage current specified of an associated photo-diode (detector) in an optical system. Generally, the chosen value of $P_{MIN}$ produces a detector current sufficient to provide reliable data transmission between the laser diode and the photo-diode.

Computing the desired change in low bias current according to the measured SE quickly sets the laser diode to maintain $P_{AVE}$ within the target range (see FIG. 1). This approach increases the speed of adjustment of $I_0$ compared to a conventional monotonic step-wise adjustment, and avoids fluctuations in the output power that can arise as the step-wise adjusted laser diode settles into a steady state.

However, merely increasing the DATA 0 current to $I_{0'}$ still results in a decrease in the average light output power if the SE decreases with age/temperature. In a further embodiment, $I_{MOD}$ is also adjusted to produce a $P_{AVE}$ at a selected value (e.g. $P_{AVE\_TARGET}$) or within a target range. In a particular embodiment, $I_{MOD}$ is adjusted in situations where $I_{0'}$ would be at a maximum specified value $I_{0\_MAX}$ (see FIG. 3). The lifespan of the laser diode is reduced if $I_0$ is too high. Similarly, a high $I_0$ increases noise generation and reduces the extinction ratio of the laser diode. Therefore, it is desirable to keep $I_0$ below $I_{0\_MAX}$.

Figure 3:
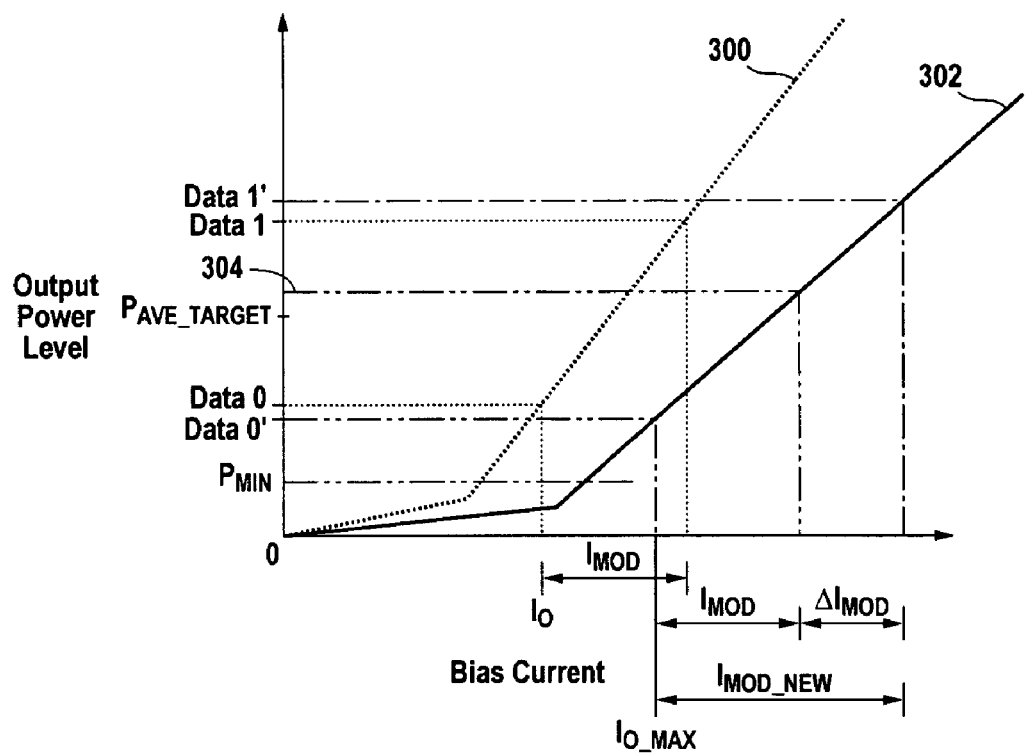
FIG. 3 shows plots of light output power versus bias current for an exemplary laser diode illustrating adjusting the modulation current to account for temperature, process, or aging drifts according to an embodiment of the invention.

FIG. 3 shows plots of light output power versus bias current for an exemplary laser diode illustrating adjusting the modulation current to account for temperature, process, or aging drifts according to an embodiment of the invention. A first plot 300 shows an initial power-current characteristic of a laser diode, and the second plot 302 shows a subsequent power-current characteristic of the laser diode after aging or at an elevated temperature. $P_{AVE\_TARGET}$ is maintained by adjusting both $I_0$ and $I_{MOD}$.

As discussed above in relation to FIG. 2, $I_0$ is increased. However, increasing $I_0$ sufficiently to maintain the original DATA 0 output power would exceed $I_{0\_MAX}$. Thus, the output power at $I_{\_MAX}$ (DATA 0') is less than the original DATA 0 output power. Furthermore, when the original $I_{MOD}$ is added to $I_{0\_MAX}$, the output power 304 is only slightly higher than $P_{AVE\_TARGET}$. The average of the new DATA 1 output power level 304 and the DATA 0' output power, results in an average power much less than $P_{AVE\_TARGET}$.

Adjusting $I_{MOD}$ allows $I_0$ to remain at or below $I_{0\_MAX}$ while providing the desired $P_{AVE\_TARGET}$. A value $I_{MOD}$ is calculated and added to the original $I_{MOD}$ value to result in $I_{MOD\_NEW}$. $I_{MOD\_NEW}$ produces a new HIGH output power level (DATA 1') that, when added to the DATA 0' output power level, provides the desired $P_{AVE\_TARGET}$.

Figure 4:
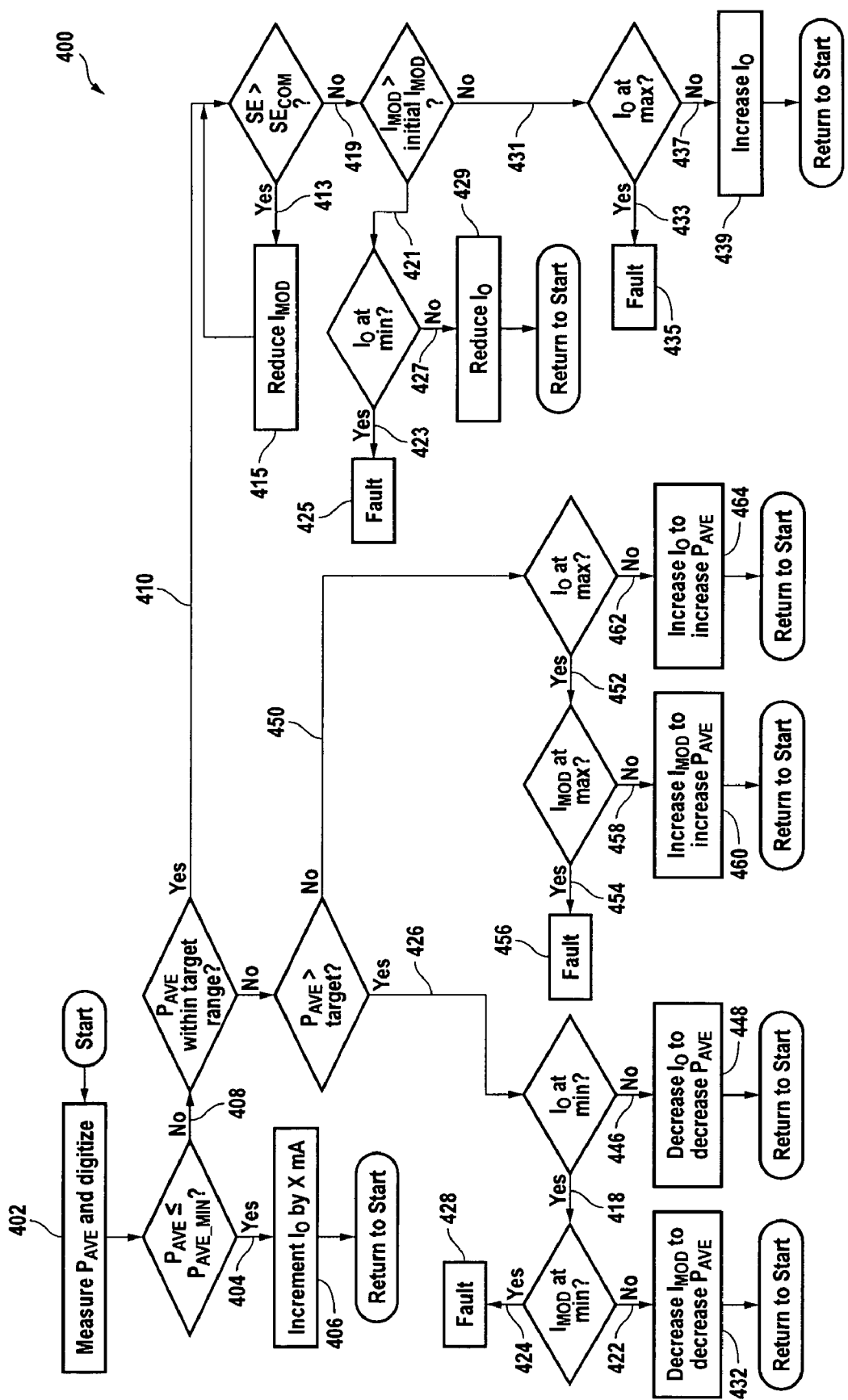
FIG. 4 is a flow chart of an exemplary method of controlling a laser diode according to an embodiment of the invention.

FIG. 4 is a flow chart of an exemplary method 400 of controlling a laser diode according to an embodiment of the invention. $P_{AVE}$ is measured by a photodetector, such as a photodiode, converted into a voltage (e.g. using a transimpedance amplifier), and digitized (step 402). If $P_{AVE}$ is less than or equal to $P_{AVE\_MIN}$ (see FIG. 1) (branch 404), $I_0$ is increased by an amount ("X") (step 406) and the method returns to the starting point. The value of X depends on the specific application of the laser diode and is generally chosen to provide a reasonably optimum value that will not violate an eye safety or timing specification (e.g. by increasing the current in too big of an increment). In a particular embodiment, X is about 1.3 mA. When $P_{AVE}$ is not less than $P_{AVE\_MIN}$ (branch 408), $P_{AVE}$ is checked to see if it is within the target range. Variation from the target range will prompt a digital controller to carry out a compensation operation.

If $P_{AVE}$ is within the target range (branch 410), the ER is optionally checked by determining whether the measured SE is greater than a desired SE that is computed ("$SE_{COM}$"). If the measured SE is greater than $SE_{COM}$ (branch 413), $I_{MOD}$ is reduced by a selected value (step 415), and the SE is measured again. The $SE_{COM}$ is an SE known to produce an ER within a specified range, based on the characterization between SE, ER, and $I_{MOD}$. In a particular embodiment, the reduction in $I_{MOD}$ is calculated according to the relationship between SE (which has been measured), ER (which is specified), and $I_{MOD}$. Thus, $I_{MOD}$ is calculated to produce the desired ER.

If the measured SE is not greater than the desired $SE_{COM}$ (branch 419), $I_{MOD}$ is checked to determine if it is greater than the initial $I_{MOD}$. If $I_{MOD}$ is greater than the initial $I_{MOD}$ (branch 421) and $I_0$ is at the minimum value (branch 423), a fault condition occurs (step 425) because the bias current cannot be reduced further. If $I_0$ is not at the minimum value (branch 427), $I_0$ is reduced a selected amount (step 429) and the process is returned to the start. An example of determining the desired selected reduction is described below in reference to FIG. 5A.

If $I_{MOD}$ is not greater than the initial $I_{MOD}$ (branch 431) and $I_0$ is at its maximum value (branch 433), a fault condition (step 435) occurs because the bias current cannot be further increased. If $I_0$ is not at its maximum value (branch 437), $I_0$ is increased a selected amount (step 439) and the process returns to the start. An example of determining the desired selected increase is described below in reference to FIG. 5B.

If $P_{AVE}$ is greater than the maximum target value (branch 426), $I_0$ is checked to insure that it is not already at the minimum value. If $I_0$ is at the minimum value (branch 418), an attempt is made to adjust $I_{MOD}$. If $I_{MOD}$ cannot be reduced (branch 424), a fault (step 428) occurs because both the bias current and the modulation currents cannot be further reduced to reduce $P_{AVE}$. If $I_{MOD}$ can be reduced (branch 422), $I_{MOD}$ is reduced a selected amount (step 432), and the process returns to the start. An example of determining the desired selected decrease in $I_{MOD}$ is described below in reference to FIG. 6A.

If $I_0$ is not at the minimum value (branch 446), $I_0$ is decreased to decrease $P_{AVE}$ (step 448). In a particular embodiment, $I_0$ is decreased by a value ($I_0$) calculated from the slope of diode characteristic. Knowing the slope, one can solve for the bias current that would produce a desired $P_{AVE}$ for a given $I_{MOD}$. If $I_0$ is greater than X mA (see step 406), $I_0$ is decreased by X mA and the process returns to the start, otherwise $I_0$ is decreased by $I_0$ and the process returns to the start.

If $P_{AVE}$ is less than the minimum target value (branch 450), $I_0$ is checked to insure that it is not already at the maximum value. If $I_0$ is at the maximum value (branch 452), an attempt is made to adjust $I_{MOD}$. If $I_{MOD}$ cannot be increased (branch 454), a fault (step 456) occurs because both the bias current and the modulation currents cannot be further increased to increase $P_{AVE}$. If $I_{MOD}$ can be increased (branch 458), $I_{MOD}$ is increased a selected amount (step 460) and the process returns to the start. An example of determining the desired selected increase in $I_{MOD}$ is described below in reference to FIG. 6B.

If $I_0$ is not at the maximum value (branch 462), $I_0$ is inecreased to increase $P_{AVE}$ (step 464). In a particular embodiment, $I_0$ is increased by a value ($I_0$) calculated from the slope of diode characteristic. Knowing the slope, one can solve for the bias current that would produce the desired $P_{AVE}$ for a given $I_{MOD}$. If $I_0$ is greater than X mA (see step 406), $I_0$ is increased by X mA and the process returns to the start, otherwise $I_0$ is increased by $I_0$ and the process returns to the start.

Figure 5A:
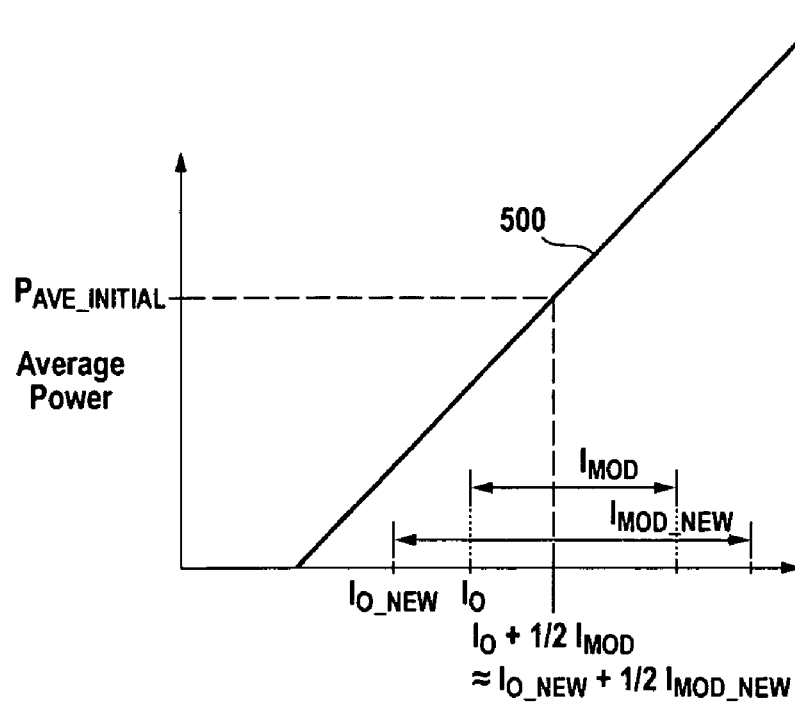
FIG. 5A is a plot of a portion of a diode characteristic illustrating how to adjust the bias and modulation currents to improve ER.

FIG. 5A is a plot of a portion of a diode characteristic 500 illustrating how to adjust the bias and modulation currents to improve ER. A new bias current $I_{0\_new}$ is calculated according to the slope of the curve and the desired change in ER (which is determined according to a known relationship between power and ER). The laser diode is operating at an initial bias current $I_0$ and at an initial modulation current $I_{MOD}$, which is added to the bias current during the modulated portion of the output. The initial average power $P_{AVE\_initial}$ occurs at a current of $I_0 + \frac{1}{2}I_{MOD}$. The bias current is reduced to $I_{0\_new}$, and the modulation current is increased to $I_{MOD\_new}$ in order to maintain the average output power at an essentially constant level while increasing ER. The new average output power, occurs at $I_{0\_new} + \frac{1}{2}I_{MOD\_new}$, might not be exactly the same as $P_{AVE\_initial}$ due to digitization errors. For example, in a particular embodiment, the modulation current is stepped from a minimum value (e.g. zero mA) to a maximum value (e.g. about 12 mA) in eight steps (digital values 0-7). The bias current is stepped from a minimum value (e.g. a current above the expected threshold current) to a maximum value (e.g. the bias current just below which a safety issue might arise when the total of the bias current and the modulation current produces an unsafe light power output) in 256 steps (digital values 0-255). These values are merely exemplary. Other laser diodes might have different minimum and maximum modulation current values, and other control systems might have finer or coarser adjustments.

Figure 5B:
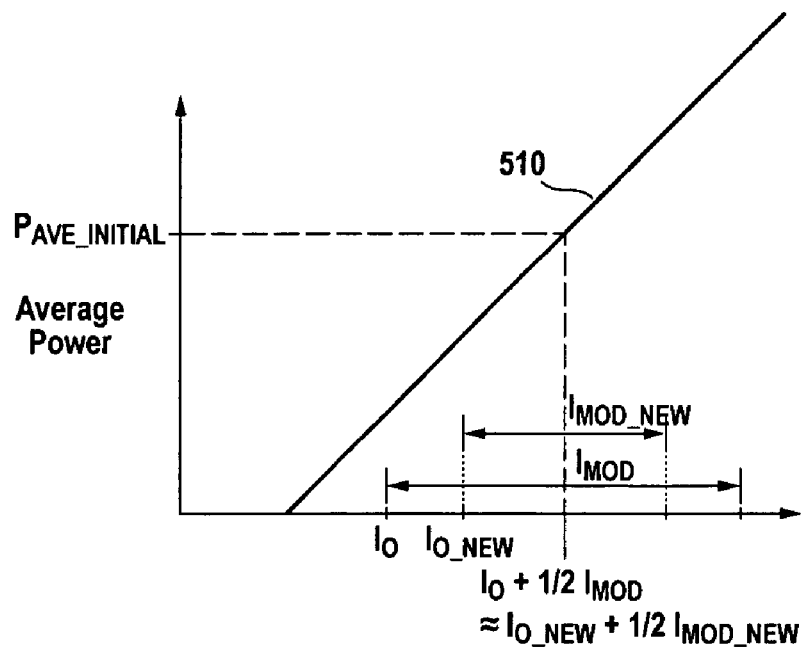
FIG. 5B is a plot of a portion of a diode characteristic illustrating how to adjust the bias and modulation currents to improve ER.

FIG. 5B is a plot of a portion of a diode characteristic 510 illustrating how to adjust the bias and modulation currents to reduce ER. A new bias current $I_{0\_new}$ is calculated according to the slope of the curve and the desired change in ER (which is determined according to a known relationship between power and ER). The laser diode is operating at an initial bias current $I_0$ and at an initial modulation current $I_{MOD}$, which is added to the bias current during the modulated portion of the output. The initial average power $P_{AVE\_initial}$ occurs at a current of $I_0+\frac{1}{2}I_{MOD}$. The bias current is increases to $I_{0\_new}$, and the modulation current is decreased to $I_{MOD\_new}$, in order to maintain the average output power at an essentially constant level while reducing ER. The new average output power, occurs at $I_{0\_new}+\frac{1}{2}I_{MOD\_new}$, might not be exactly the same as $P_{AVE\_initial}$ due to digitization errors. For example, in a particular embodiment, the modulation current is stepped from a minimum value (e.g. zero mA) to a maximum value (e.g. about 12 mA) in eight steps (digital values 0-7). The bias current is stepped from a minimum value (e.g. a current above the expected threshold current) to a maximum value (e.g. the bias current just below which a safety issue might arise when the total of the bias current and the modulation current produces an unsafe light power output) in 256 steps (digital values 0-255). These values are merely exemplary. Other laser diodes might have different minimum and maximum modulation current values, and other control systems might have finer or coarser adjustments.

Figure 6A:
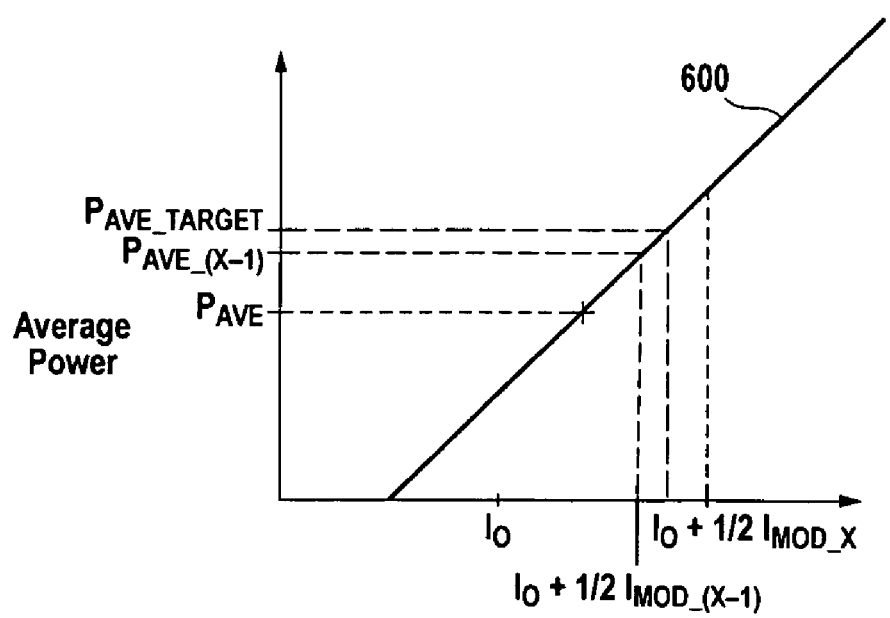
FIG. 6A is a plot of a portion of a diode characteristic illustrating an embodiment of adjusting the modulation current to achieve a target average power when the bias current is at a maximum value.

FIG. 6A is a plot of a portion of a diode characteristic 600 illustrating an embodiment of adjusting the modulation current to achieve a target average power when the bias current is at a maximum value. In a particular embodiment, modulation current is adjusted in a step-wise fashion. Each step increases or decreases the modulation current by a pre-selected amount. In some embodiments, each step is the same amount, alternatively, some steps are greater or less than others.

The bias current $I_0$ is at the maximum allowable value in a particular diode and application. To achieve a target average power level $P_{AVE\_target}$ when the current power $P_{AVE}$ is too low, the average power is increased by increasing the modulation current. The initial modulation current is at an initial selected level. For example, in a system providing an 8-step adjustment of modulation current, the modulation current is set at a level according to the fourth adjustment step (i.e. n=3, where n is a value between 0-7). The modulation current is increased by increasing n to 4 or higher, and is decreased by decreasing n to 2 or less. In some embodiments, the adjustment of modulation current is relatively coarse. In such cases, it is desirable to set n to the value that will produce an average output power closest to the $P_{AVE\_target}$.

In the linear portion of the diode characteristic, the average output power occurs at the bias current plus one-half the modulation current. Knowing the slope of the diode characteristic in this region allows calculation of the modulation current that will produce $P_{AVE\_target}$ at a given bias current $I_0$, which is this example is at the maximum value. However, because modulation current is adjusted in relatively coarse steps (compared to the bias current), increasing the modulation current (i.e. increasing the value of n) usually does not result exactly in $P_{AVE\_target}$. It is desirable to select the value of n that results in an average power level closest to $P_{AVE\_target}$.

If $I_0$ is at its maximum value (e.g. 255) and $I_{MOD}$ is not at its maximum value (e.g. n is less than seven), average power output can be increased by increasing $I_{MOD}$, that is, by increasing n. If n=6, then n may only be increased to seven. However, if n is less than 6, it may be increased at least two steps. The modulation current that would produce $P_{AVE\_target}$ is calculated ($P_{AVE\_target}$ occurs at $I_0+\frac{1}{2}I_{MODtarget}$), and the value of n that produces the closest average power output is determined. In other words, the value of n that produces a modulation current closest to $I_{MOD\_target}$ is calculated. In the event where n is increased to a higher value x, $\frac{1}{2}I_{MOD\_x}$ is compared to $\frac{1}{2}I_{MOD\_(x-1)}$ to see which value produces a modulation current closest to $\frac{1}{2}I_{MOD\_target}$. In this example, x-1 produces the more desirable modulation current, and $P_{AVE\_(x-1)}$ is slightly less than $P_{AVE\_target}$. In an alternative example (not illustrated), $I_{MOD\_x}$ is the more desirable modulation current.

Figure 6B:
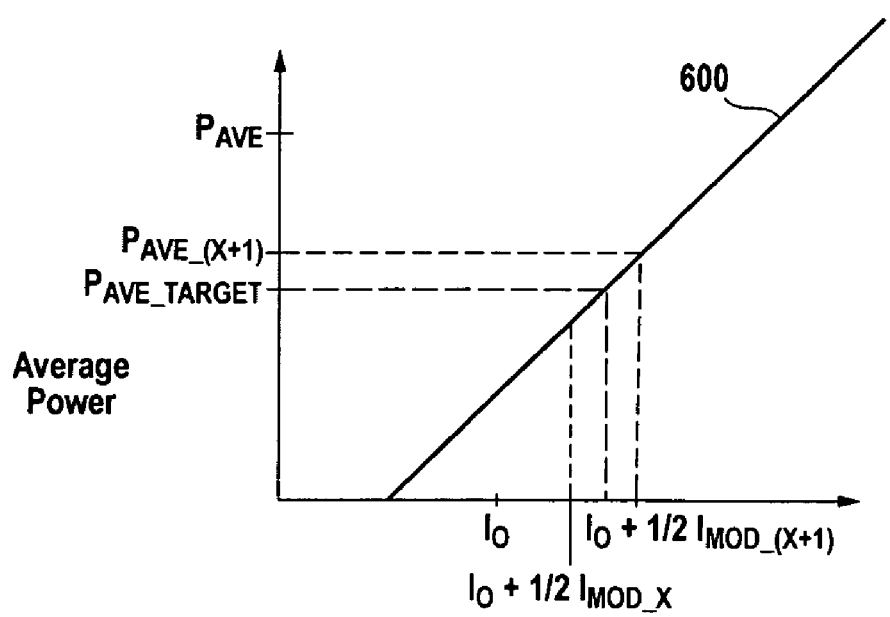
FIG. 6B is a plot of a portion of a diode characteristic illustrating an embodiment of adjusting the modulation current to achieve a target average power when the bias current is at a minimum value.

FIG. 6B is a plot of a portion of a diode characteristic 610 illustrating an embodiment of adjusting the modulation current to achieve a target average power when the bias current is at a minimum value. In a particular embodiment, modulation current is adjusted in a step-wise fashion. Each step increases or decreases the modulation current by a pre-selected amount. In some embodiments, each step is the same amount, alternatively, some steps are greater or less than others.

The bias current $I_0$ is at the minimum allowable value in a particular diode and application. To achieve a target average power level $P_{AVE\_target}$ when the current power is too high, the average power is decreased by decreasing the modulation current. The initial modulation current is at an initial selected level. For example, in a system providing an 8-step adjustment of modulation current, the modulation current is set at a level according to the fourth adjustment step (i.e. n=3, where n is a value between 0-7). The modulation current is increased by increasing n to 4 or higher, and is decreased by decreasing n to 2 or less. In some embodiments, the adjustment of modulation current is relatively coarse. In such cases, it is desirable to set n to the value that will produce an average output power closest to the $P_{AVE\_target}$.

In the linear portion of the diode characteristic, the average output power occurs at the bias current plus one-half the modulation current. Knowing the slope of the diode characteristic in this region allows calculation of the modulation current that will produce $P_{AVE\_target}$ at a given bias current $I_0$, which is this example is at the minimum value. However, because modulation current is adjusted in relatively coarse steps (compared to the bias current), decreasing the modulation current (i.e. decreasing the value of n) usually does not result exactly in $P_{AVE\_target}$. It is desirable to select the value of n that results in an average power level closest to $P_{AVE\_target}$.

If $I_0$ is at its minimum value (e.g. 0) and $I_{MOD}$ is not at its minimum value (e.g. n is greater than zero), average power output can be decreased by decreasing $I_{MOD}$, that is, by decreasing n. If n=1, then n may only be decreased to zero. However, if n is greater than 1, it may be decreased at least two steps. The modulation current that would produce $P_{AVE\_target}$ is calculated ($P_{AVE\_target}$ occurs at $I_0+\frac{1}{2}I_{MOD\_target}$), and the value of n that produces the closest average power output is determined. In other words, the value of n that produces a modulation current closest to $I_{MOD\_target}$ is calculated. In the event where n is decreased to a lower value x, $\frac{1}{2}I_{MOD\_x}$ is compared to $\frac{1}{2}I_{MOD\_(x+1)}$ to see which value produces a modulation current closest to $\frac{1}{2}I_{MOD\_target}$. In this example, x+1 produces the more desirable modulation current, and $P_{AVE\_(x+1)}$ is slightly greater than $P_{AVE\_target}$. In an alternative example (not illustrated), $I_{MOD\_x}$ is the more desirable modulation current.

Figure 7:
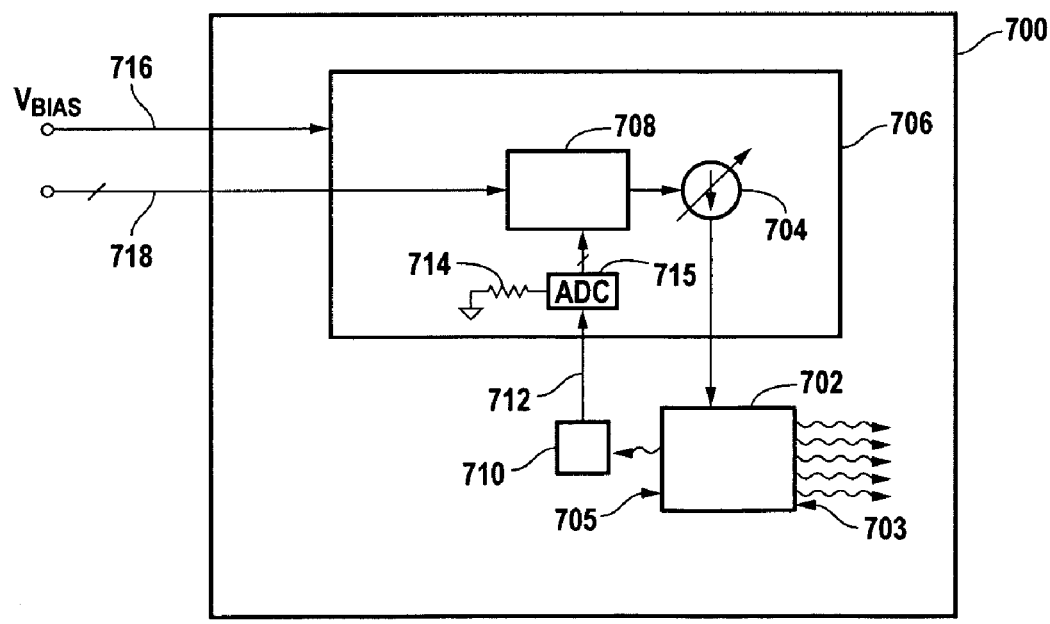
FIG. 7 is a plan view of a laser diode system according to an embodiment of the invention.

FIG. 7 is a plan view of a laser diode system 700 according to an embodiment of the invention. A laser diode 702 emits light from a front facet 703 according to the current provided to the laser diode 702 from a controllable current source 704 that is part of a laser driver chip 706. The laser driver chip 706 also includes a digital controller 708. A photodetector 710, such as a photodiode, produces a detector signal 712 that is proportional to the light power level emitted by the laser diode. In this embodiment, the laser diode 702 "leaks" light from a back facet 705. The amount of light from the back facet 705 is proportional to the light emitted from the front facet 703, but much less intense. In a particular embodiment, the photodetector produces a current that is converted to a voltage by passing the current through a sense resistor 714. The sense resistor is not integrated in the laser driver chip in another embodiment. Alternatively, a trans-impedance amplifier is used to convert the photo-detector current to voltage instead of a resistor.

The detector signal is digitized by an analog-to-digital converter ("ADC") 715. The digital controller is a digital logic circuit that performs a method according to an embodiment of the invention. Alternatively, methods according to embodiments of the invention are performed by a microcontroller that is not integrated in the laser driver chip. The laser driver chip receives power on a bias line 716 that provides the power to operate both the laser diode and the laser driver chip, and receives a control signal on a control line 718 that indicates whether the laser diode should be in a DATA 1 condition or a DATA 0 condition.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method of controlling a laser diode comprising:
   measuring an average light output power of the laser diode, the average light output power being an average of a low light output power at a low bias current and a high light output power at a high bias current;
   comparing the average light output power to an average light output power target range; and
   if the average light output power is not within the target range,
      measuring a first light output power at a first bias current; measuring a second light output power at a second bias current, wherein each of the first light output power and the second light output power are greater than a minimum light output power,
      computing a slope efficiency from the first light output power, the first bias current, the second light output power, and the second bias current,
      calculating a new bias current, and
      biasing the laser diode at the new bias current so as to produce a new average light output power within the average light output target range.

2. The method of claim 1 wherein the new bias current is a new low bias current.

3. The method of claim 2 wherein the low bias current is greater than a minimum low bias current and the new low bias current is less than the low bias current so as to provide a lower new average light output power.

4. The method of claim 2 wherein the low bias current is less than a maximum low bias current and the new low bias current is greater than the low bias current so as to produce a higher new average light output power.

5. The method of claim 1 wherein the new bias current is a new high bias current.

6. The method of claim 5 wherein the low bias current is a maximum low bias current and the new high bias current is greater than the high bias current so as to produce a higher average light output power.

7. The method of claim 5 wherein the low bias current is a minimum low bias current and the new high bias current is less than the high bias current so as to produce a lower average light output power.

8. The method of claim 1 further comprising steps, after the step of biasing the laser diode at the new bias current so as to produce a new average light output power within the average light output target range of: comparing a slope efficiency of the laser diode against a desired slope efficiency; and, if the slope efficiency is greater than the desired slope efficiency, reducing the high bias current.

9. The method of claim 1 further comprising steps, after the step of biasing the laser diode at the new bias current so as to produce a new average light output power within the average light output target range of: comparing a slope efficiency of the laser diode against a desired slope efficiency; and, if the slope efficiency is not greater than the desired slope efficiency, adjusting the low bias current.

10. The method of claim 9 wherein the new bias current is a new high bias current greater than the high bias current, the low bias current is greater than a minimum low bias current, and the step of adjusting the low bias current comprises reducing the low bias current.

11. The method of claim 9 wherein the new bias current is a new high bias current not greater than the high bias current, the low bias current is less than a maximum low bias current, and the step of adjusting the low bias current comprises increasing the low bias current.

12. A method of controlling a laser diode comprising:
   measuring an average light output power of the laser diode, the average light output power being an average of a low light output power at a low bias current and a high light output power at a high bias current;
   comparing the average light output power to an average light output power target range; and
   if the average light output power is within the target range,
      measuring a first light output power at a first bias current; measuring a second light output power at a second bias current, wherein each of the first light output power and the second light output power are greater than a minimum light output power,
      computing a slope efficiency from the first light output power, the first bias current, the second light output power, and the second bias current, the average light output power having an extinction ratio, and
      adjusting at least one of the low bias current and the high bias current so as to provide a new average light output power within the average light output power target range, the new average light output power having an improved extinction ratio.

* * * * *